United States Patent [19]
Saito et al.

[11] Patent Number: 4,860,260
[45] Date of Patent: Aug. 22, 1989

[54] SEMICONDUCTOR MEMORY DEVICE WITH TESTING OF REDUNDANT MEMORY CELLS

[75] Inventors: Shinji Saito, Yokohama; Shigeru Atsumi, Tokyo; Sumio Tanaka, Oomorini, all of Japan

[73] Assignee: Kabushiki Kaisha Toshiba, Kawasaki, Japan

[21] Appl. No.: 59,970

[22] Filed: Jun. 9, 1987

[30] Foreign Application Priority Data

Jun. 12, 1986 [JP] Japan .................. 61-136838

[51] Int. Cl.⁴ .................. G11C 7/00; G11C 29/00
[52] U.S. Cl. .................. 365/201; 371/10; 371/21; 365/200
[58] Field of Search ........... 365/200, 201, 96; 371/8, 10, 21; 324/73 R

[56] References Cited

U.S. PATENT DOCUMENTS

| 4,365,319 | 12/1982 | Takemae | 365/200 |
| 4,392,211 | 7/1983 | Nakano et al. | 365/200 |
| 4,428,068 | 1/1984 | Baba | 365/201 X |
| 4,468,759 | 8/1984 | Kung et al. | 365/201 |
| 4,549,101 | 10/1985 | Sood | 365/201 X |
| 4,648,075 | 3/1987 | Segawa et al. | 371/10 X |
| 4,651,304 | 3/1987 | Takata | 365/201 |
| 4,720,818 | 1/1988 | Takeguchi | 365/201 |

FOREIGN PATENT DOCUMENTS 56297  4/1983  Japan .................. 371/10

Primary Examiner—Stuart N. Hecker
Assistant Examiner—Andrew L. Sniezek
Attorney, Agent, or Firm—Finnegan, Henderson, Farabow, Garrett, & Dunner

[57] ABSTRACT

A semiconductor memory device includes a main memory cell array, a redundancy memory cell array, bonding pads for receiving an address signal, a row decoder for selecting a row of the main memory cell array in accordance with the row address signal, and an exchange controller connected to receive the address signal, which is programmable to inhibit the selective operation of the row decoder to select the row of the redundancy memory cell array, in response to specific address signals. The semiconductor memory device further includes bonding pads, each for receiving a test signal. The exchange controller is connected to receive the test signal for inhibiting the selective operation of the row decoder and selecting the row of the redundancy memory cell array, in response to the test signal.

14 Claims, 5 Drawing Sheets

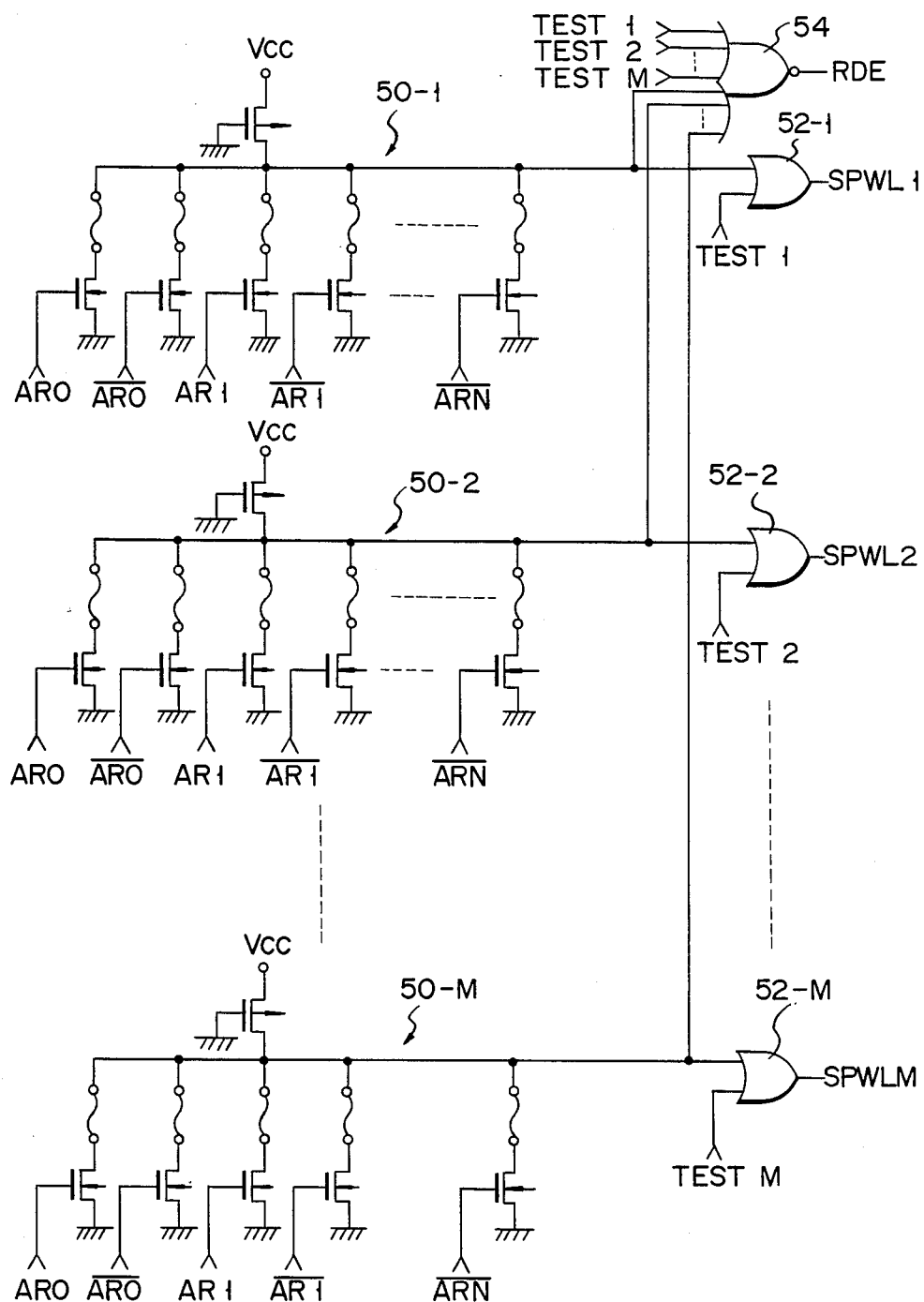
F I G. 5

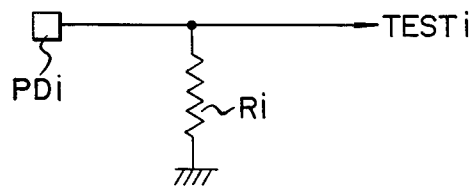
F I G. 6
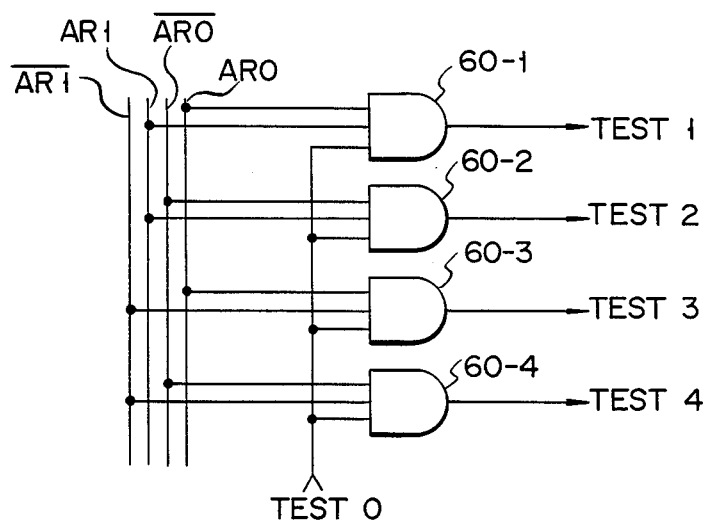
F I G. 7
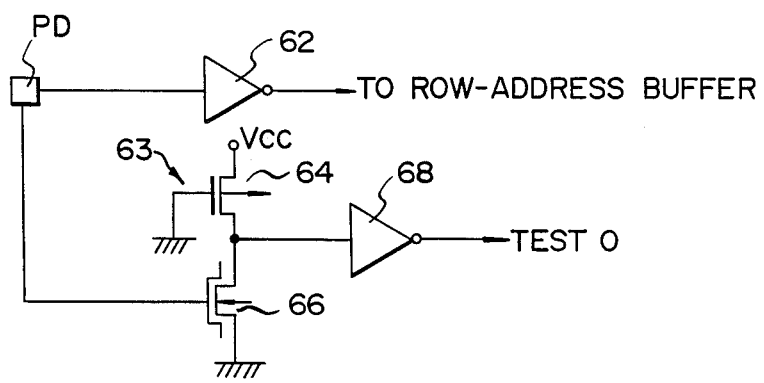
F I G. 8

SEMICONDUCTOR MEMORY DEVICE WITH TESTING OF REDUNDANT MEMORY CELLS

BACKGROUND OF THE INVENTION

This invention relates to a semiconductor memory device and, in particular, to a semiconductor memory device with redundancy memory cells.

Recently, more and more semiconductor memory devices of high integration density have been developed in the art. High integration of the semiconductor devices causes a low yield in the fabrication of the semiconductor memory device. During the inspection process, all the memory cells of the respective semiconductor devices are tested for defects and if a few as one memory cell of a memory device is found to be defective, the memory device in question is usually considered to be defective. The number of defective memory cells increases as the number of memory cells incorporated in a semiconductor memory device increases. The technique of redundancy improves the yield of such semiconductor devices. This technique entails the incorporation of a redundancy memory cell array and exchange circuit, together with a main memory cell array, in the semiconductor memory device, and replaces the defective memory cells of the main memory cell array by the memory cells of the redundancy memory cell array in units of their row or column. Where any defective memory cells of the main memory cell array are to be replaced in units of their row, an exchange circuit causes the redundancy memory cell array to operate in place of the main memory cell array when a row address signal designates the row containing the defective memory cell of the main memory cell array. The exchange circuit has at least one programmable address detector for detecting a specified row address signal. As a method for programming the specified row address, a method which utilizes an EPROM, for example, is known, together with a method which utilizes fuse elements on a poly-Si structure, which are blown by a laser beam, etc.

FIG. 1 shows a programmable address detector which utilizes fuses. The address detector is supplied with a row address signal A of, for example, N bits, as well as a complementary replica $\overline{A}$ of row address signal A. In FIG. 1, A0, A1, ..., AN represent the bits of row address signal A and $\overline{A0}, \overline{A1}, ..., \overline{AN}$ represent the bits of complementary replica $\overline{A}$. The address detector includes fuses 10-0, 10-1, ..., 10-N and 11-0, 11-1, ..., 11-N, p-channel MOS transistor 12 for a load, and n-channel MOS transistors 14-0, 14-1, ..., 14-N and 15-0, 15-1, ..., 15-N for drivers. The current path of MOS transistor 12 is connected at one end to a source potential terminal VCC (=5 V), and at the other end to an output line OUT. The output line OUT is connected to one of the spare word lines in the redundancy memory cell array. The gate of MOS transistor 12 is connected to a ground potential terminal VSS (=0 V) Fuses 10-0, 10-1, ..., 10-N and 11-1, 11-2, ..., 11-N are connected at one end to output line OUT, and at the other end to ground potential terminal VSS via the current paths of MOS transistors 14-0, 14-1, ..., 14N and 15-0, 15-1, ..., 15N. The gates of MOS transistors 14-0, 14-1, ..., and 14N are connected to bits A0, A1, ..., AN, and the gates of MOS transistors 15-0, 15-1, ..., 15-N are connected to bits $\overline{A0}, \overline{A1}, ..., \overline{AN}$.

Before the programming or substitution step, fuses 10-1, 10-1, ..., 10-N and 11-0, 11-1, ..., 11-N all remain intact. When signals A and are supplied to the address detector, one of paired transistors 14-0 and 15-0, 14-1 and 15-1, ..., 14-N and 15-N are selectively turned ON. The output line OUT is set at a low potential level by the turned-ON MOS transistors and corresponding fuses.

In the programming step, one of two fuses in each fuse pair 10-0 and 11-0, 10-1 and 11-1, ..., 10-N and 11-N is selectively blown, so that the MOS transistors, which are turned ON in response to the specified signals A and $\overline{A}$, are completely separated from output lie OUT. That is, output line OUT is normally set at a low-level potential and only when the row address signal designates a row corresponding to a defective memory cell in the main memory cell array, is it set at a high-level potential.

The spare word line, which is connected to output line OUT, is placed in a selected state when the potential of output line OUT is at high level, and is placed in a nonselected state when the potential of output OUT is at low level. The output signal of the address detector is used to keep the main memory cell array in an inoperative state during the time period in which the spare word line of the redundancy memory cell array is selected.

The memory device inspection process for the detection of any possible defects will now be explained in detail.

The memory devices are inspected for defects during the manufacturing process and also upon their completion. FIG. 2 shows a general flow of the inspection procedure conducted during the manufacture of the memory devices This inspection process begins at step 20, at which the semiconductor devices are formed on a single semiconductor wafer. At step 21, a series of tests is carried out on the respective memory devices, with regard to their operation functions, in particular, a test known as a "die sort test". In this test, measurement is made of the operation current, standby current, memory access time, stability against a fluctuation in a power supply voltage, and so on. If, at the end of the test, the memory device is found to be defective, it is rejected at step 22. If, on the other hand, the memory device is found to be defect-free, it is authorized and is subsequently packaged Only when a defective memory cell is found in the main memory cell array, is the defective cell subjected to a substitution process, at step 24. That is, the fuses in the address detector are selectively blown so that a specified address signal for designating the row containing the defective memory cell can be detected. Upon completion of this substitution process, the resultant memory device is again tested at step 25, to check whether or not it if functioning properly. If the memory device found to be functioning properly, it is accepted at step 23 and, if it is found to be defective, it is rejected at step 26.

This memory device does, however, have a the drawback in that unless the address detector is programmed, it is not possible to test whether or not the memory cells of the redundancy memory cell array are functioning properly. For this reason, the die sort test needs to be performed twice, once at step 21 and again, at step 25, hereby increasing the length of time necessary to perform inspection for defects. In the die sort test, needle-like probes are brought into contact with the bonding pads of the respective memory device. The bonding pads are normally formed of an aluminum film, and are thus liable to be damaged by the test probes. If any defective bonding occurs subsequently, as a result the bonding pads coming into contact with these probes, the yield in the fabrications of memory devices will be lowered. In view of this risk of damage, it is considered preferable to conduct a smaller number of such tests.

In particular, if the memory device is an EPROM type, the memory chip needs to be illuminated by ultraviolet radiation for a predetermined time period in order to erase the test data, thereby necessitating a greater amount of time for fabrication than is required for other memory devices. In the EPROM type memory device, furthermore, a predetermined test data pattern is generally written, during the die sort test, into the functioning memory cells. Upon completion of the memory device, subsequent to its being mold-packaged, the test data pattern is utilized once again, this time for the final inspection for defects. If the substitution process has been carried out with respect to some of the memory devices contained in the semiconductor wafer, it is then necessary to illuminate the semiconductor wafer by ultraviolet radiation, so that the retesting step can be performed on its memory devices. The test data pattern already written on the "accepted" memory device will be erased at the time this retesting step is performed. Therefore, it is necessary to once again write the test pattern data on the "accepted" memory device, prior to the packaging process.

SUMMARY OF THE INVENTION

It is accordingly the object of the present invention to provide a semiconductor memory device which can ascertain the presence of any defect in main and redundancy memory cells, by means of a signal die sort test.

According to the invention, a semiconductor memory device is provided, comprising a memory unit including a plurality of memory blocks, at least one memory blocks forming a redundancy memory section and the remaining memory blocks forming a main memory section, a pad section for receiving an address signal and a test signal, a selection circuit connected to the pad section, for selecting the memory block of said main memory section in accordance with the address signal, and an exchange controller connected to the pad section, which is programmable to inhibit the selective operation of the selection circuit and to select the memory cell block of said redundancy memory section, in response to a specified address signal, and which inhibits the selective operation of said selection circuit and selects the memory cell block of said redundancy memory section, in response to the test signal.

According to the present invention, even before the substitution process or programming process is carried out, the exchange controller can select, in response to the test signal, the memory block of the redundancy memory section. Whether or not the main and redundancy memory cells are functioning properly can be ascertained by means of a single die sort test. As a result, it is not necessary to carry out the function test for the redundancy memory section, after the substitution process has been performed. It is also possible to reduce the time required for an inspection for defects to be performed, and to improve upon the lower yield resulting from possible defective bonding of the bonding pads.

BRIEF DESCRIPTION OF THE DRAWINGS

FIG. 5 is a view showing the detailed arrangement of an exchange as shown in FIG. 3;

FIG. 6 is a circuit showing an input section for receiving a test signal (FIG. 3) from outside of a memory device chip;

FIG. 7 is an explanatory view explaining a semiconductor memory device according to a second embodiment of this invention, this embodiment being similar to the first embodiment, except for the addition of a decode circuit for internally generating a test signal, as shown in FIG. 3; and FIG. 8 is an explanatory view for explaining a semiconductor memory device according to a third embodiment of this invention, this embodiment being similar to the second embodiment, except for the addition of a detector circuit for detecting that a potential of predetermined level is applied to a bonding pad, as a test signal.

DETAILED DESCRIPTION OF THE PREFERRED EMBODIMENTS

The semiconductor memory device according to a first embodiment of the present invention will now be described below with reference to FIGS. 3 to 6.

This memory device is manufactured as an EPROM. In the manufacture of the semiconductor memory devices, a semiconductor wafer is initially prepared and a plurality of semiconductor memory devices are formed within the semiconductor wafer. In this state, all the semiconductor memory devices in the semiconductor wafer are subjected to a defect inspection. After the inspection has been made, the semiconductor wafer is divided into a plurality of chips by a dicing process and the functioning semiconductor device chip, which has been accepted as a defect-free one, is contained as a finished product in a mold package.

Figure 1:
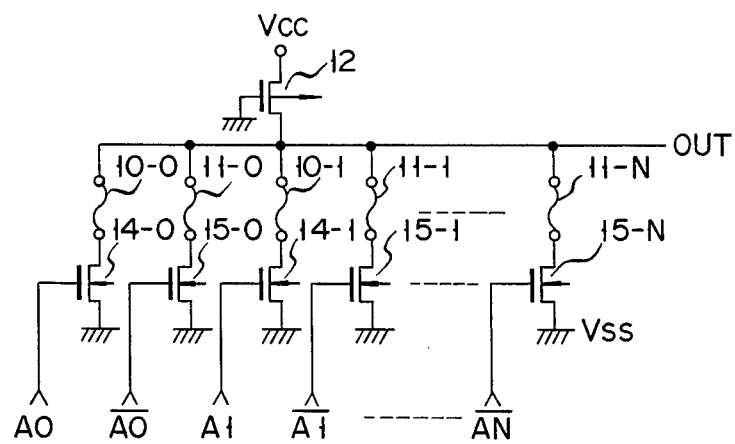
FIG. 1 shows a known programmable address detector that utilizes fuses.
Figure 2:
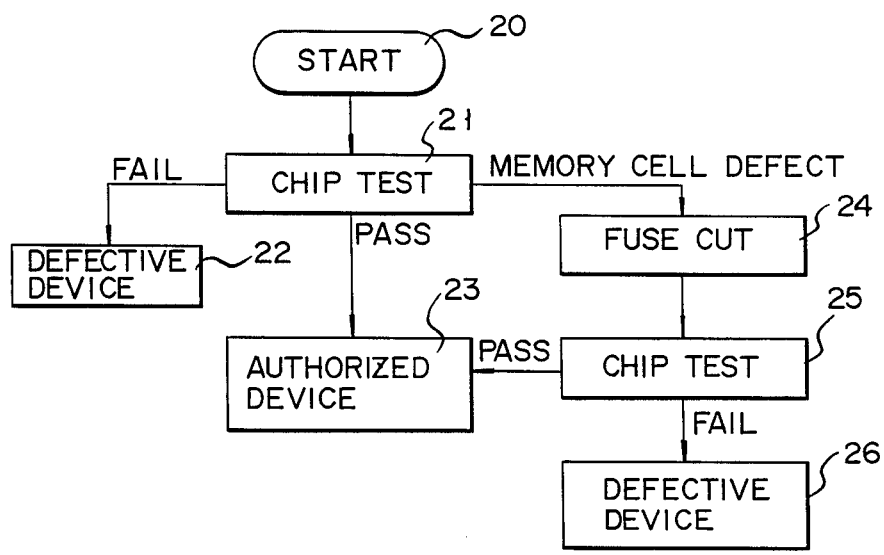
FIG. 2 is a general flow of an inspection procedure for detecting defects in the manufacture of memory devices.
Figure 3:
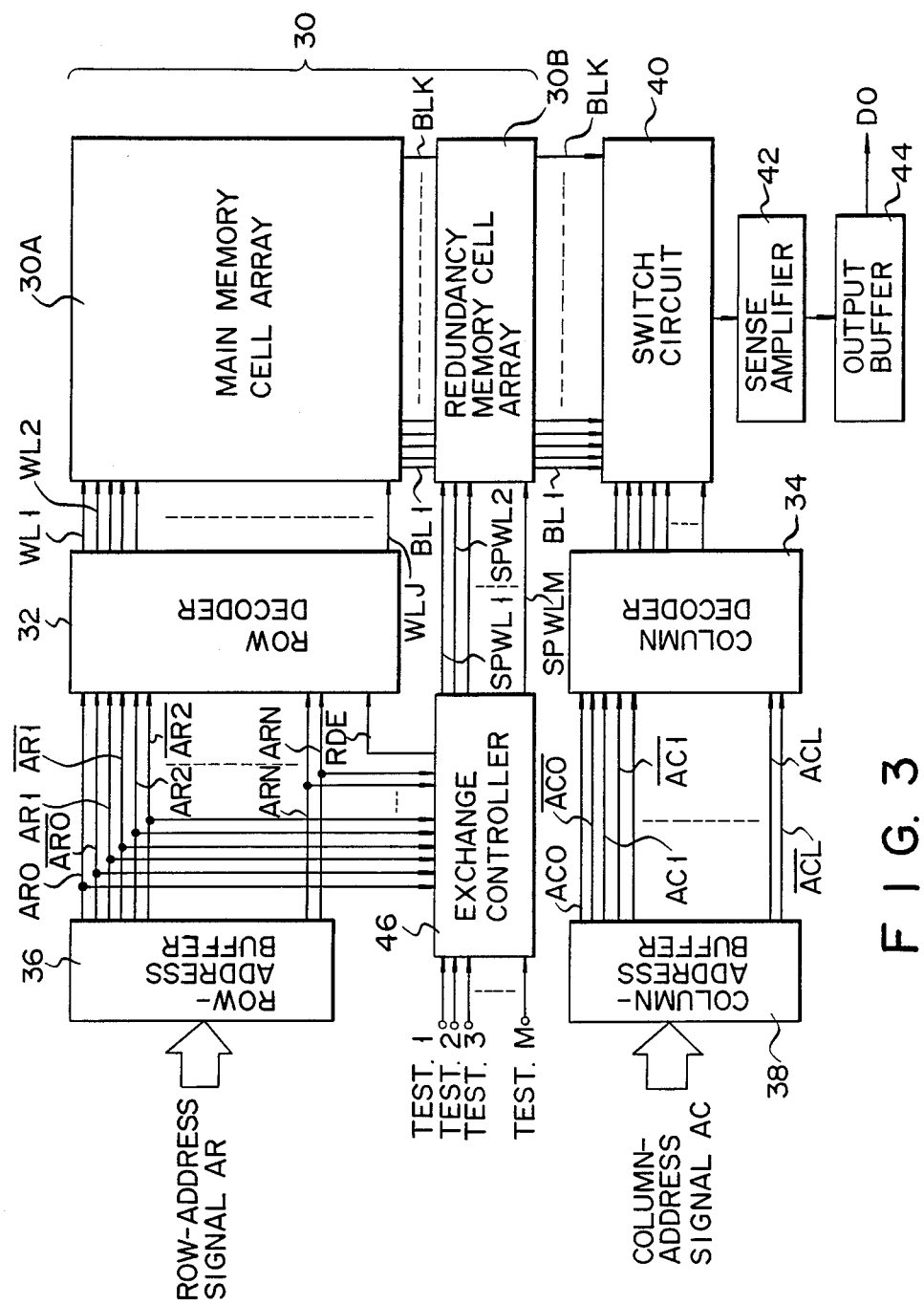
FIG. 3 is a view schematically illustrating the circuit of a semiconductor memory device according to open embodiment of the present invention.

FIG. 3 is a schematic diagram showing a circuit of the semiconductor memory device. The semiconductor memory device includes memory unit 30 formed of memory cells arranged in a matrix fashion. Memory unit 30 is divided into main memory cell array 30A and redundancy memory cell array 30B. Where there is a defect on main memory cell array 30A redundancy memory cell array 30B is used, in row units, relative to main memory cell array 30A. Word lines WL1 to WLJ are formed along the rows of main memory cell array 30A. With the main memory cell array, the memory cells in the same row are connected to one of word lines WL1 to WLJ. Spare word lines SPWL1 to SPWLM are formed along the rows of redundancy memory cell array 30B. With the redundant memory cell array, the memory cells in the same row are connected to one of spare word lines SPWL1 to SPWLM. Bit lines BL1 to BLK are formed along their common columns in main memory cell array 30A and redundancy memory cell array 30B. With the arrays 30A and 30B, the memory cells in the same column are connected to a one of bit lines BL1 to BLK.

This semiconductor memory device includes row and column decoders 32 and 34 and column address buffers 36 and 38. Row address signal AR, is externally supplied to row address buffer 36. Buffer 36 sends, together with the complementary address signal $\overline{AR}$, a address signal AR to row decoder 32. In FIG. 3, AR0, AR1, ..., ARN represent sent the bits of address signal AR, and $\overline{AR0}$, $\overline{AR1}$, ..., $\overline{ARN}$..., $\overline{ARN}$ represent the bits of address $\overline{AR}$. Row decoder 32 selects the row of the main memory cell array with respect to the address signals AR and $\overline{AR}$. The memory cells on the selected row receive a drive signal from row decoder 32 through an associated word line.

Column address signal AC is externally supplied to column address buffer 38. Buffer 38 supplies, together with the complementary address signal $\overline{AC}$, a dress signal AC to column decoder 34. In FIG. 3, AC0, AC1, ..., ACL represent the bits of address signal AC, and $\overline{AC0}$, ..., $\overline{ACL}$ represent the bits of address signal $\overline{AC}$. Column decoder 34 selects the column of memory unit 30. Switch circuit 40 receives an output signal of column decoder 34 and electrically couples the bit line corresponding to the selected column to sense amplifier 42; where the bit line thus coupled is detected and amplified. Output buffer 44 latches the output voltage of sense amplifier 42 and supplies it as readout data. The semiconductor memory device includes a writing circuit for setting each of the bit lines BL1 to BLK at a high or a low level, thereby writing one word data into the corresponding memory cells that are driven through one of the word lines WL1 to WLJ or one of the spare word lines SPWL1 to SPWLM. In this connection it is to be noted that this writing circuit is omitted for brevity's sake.

The semiconductor memory device further includes exchange controller 46 for inhibiting a selecting operation of row decoder 32 and for selecting the row of redundancy memory cell array 30B. The exchange controller is connected to row address buffer 36 to receive the address signals AR and $\overline{AR}$ and is connected to bonding pads, which serve as input terminals for test signals TEST 1 to TEST M. Test signals TEST 1 to TEST M are selected by turns and the selected one is supplied to the associated bonding pad Exchange controller 46 is programmed as to detect a specified row address signal AR indicating the row address of a defective memory cell in main memory cell array 30A. The programmable specified row addresses are restricted to M kinds in accordance with the number of rows in redundancy memory cell array 30B. Upon detection of the programmed row address signal AR, exchange controller 46 inhibits the selective operation of row decoder 32 and selects the row of redundancy memory cell array 30B in accordance with the detected specified row address signal.

A drive signal is supplied from exchange controller 46 through the associated one of spare word lines SPWL1 to SPWLM to the memory cells in the selected row. The test signals TEST 1 to TEST M are control signals for causing redundancy memory cell array 30B to operate at the time of defect inspection irrespective of the row address signals and are assigned to the rows of redundancy memory cell array 30B. Exchange controller 46, upon receipt of the any one of test signals TEST 1 to TEST M, inhibits the selecting operation of row decoder 32 and selects the row of redundancy memory cell array 30B in accordance with the test signal. The memory cells on the selected row receive a drive signal from exchange controller 46 through the associated one of the spare word lines SPWL1 to SPWLM.

Figure 4:
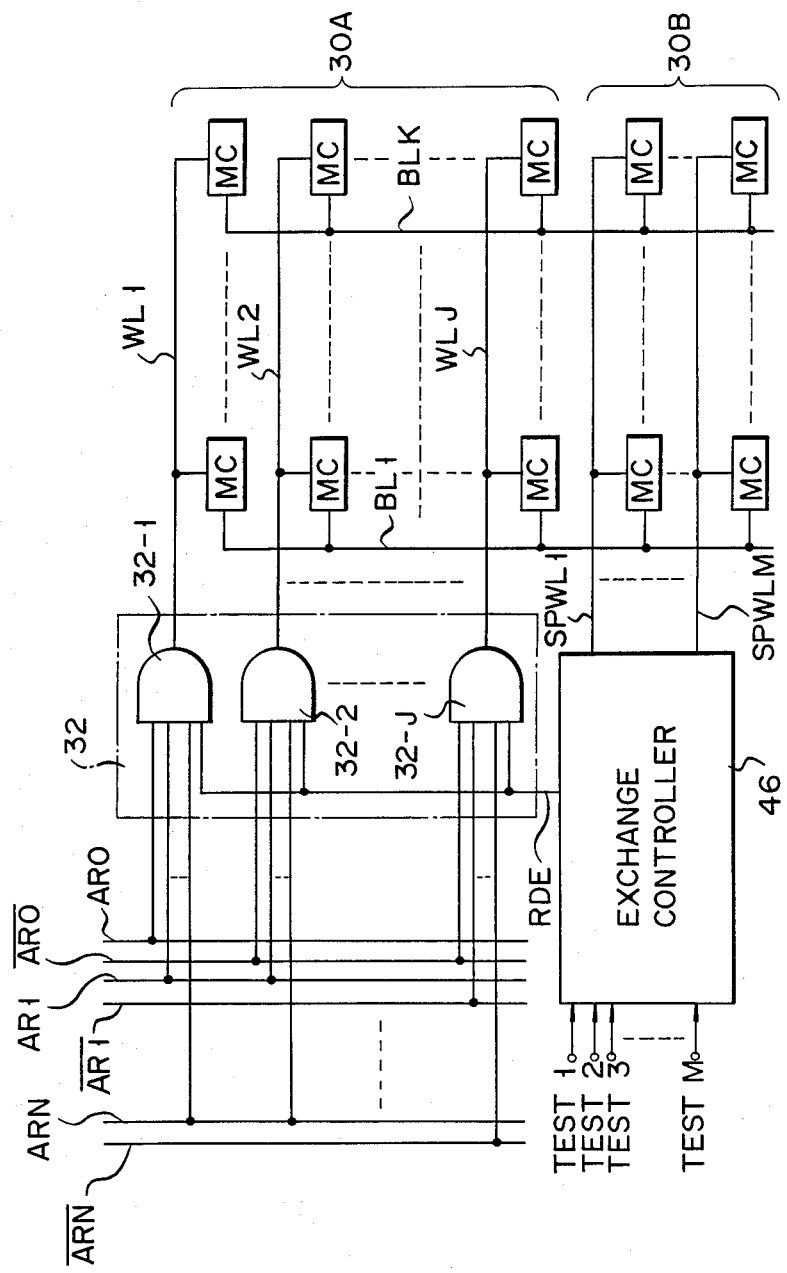
FIG. 4 shows the detailed arrangement of a memory unit and row detector as shown in FIG. 3.

FIG. 4 shows an arrangement of memory unit 30 and row decoder 32 in detail. Row decoder 32 includes, for example, AND gates 32-1 to 32-J. The input terminals of AND gates 32-1 to 32-J are selectively connected to the output terminals of row address buffer 36 as shown in FIG. 4 and to receive control signal RDE from exchange controller 46. The output terminals of AND gates 32-1 to 32-J are connected to word lines WL1 to WLJ, respectively. The selecting operation of decoder 32 is enabled during the time period in which the control signal RDE is set at a high level and disabled during the time period in which the control signal RDE is set at a low level.

FIG. 5 shows a detailed arrangement of exchange controller 46. Exchange controller 46 includes address detectors 50-1 to 50-M, 2-input OR gates 52-1 to 52-M and 2M-input NOR gate 54. The address detectors 50-1 to 50-M are configured as in the case of the conventional counterparts and programmed to detect, through the blowing of the fuse, a specified address signal of row address signal AR. The output lines of address detectors 50-1 to 50-M are respectively connected to first input terminals of OR gates 52-1 to 52M. Each of address detectors 50-1 to 50-M generates an output voltage of high level as a detection signal. Test signals TEST 1 to TEST M are supplied respectively through the bonding pads to the second terminals of OR gates 52-1 to 52-M. Each of test signals TEST 1 to TEST M is supplied as a voltage signal of high level. The output terminals of OR gates 52-1 to 52-M are respectively connected to spare word lines SPWL1 to SPWLM. The input terminals of NOR gate 54 are connected to the output lines of address detectors 50-1 to 50M and connected to receive the test signals TEST 1 to TEST M through the bonding pads. The output signal of NOR gate 54 is supplied as a control signal RDE to decoder 32.

The operation of the semiconductor memory device at the time of defect inspection will be explained below.

At the time of defect inspection, the memory cells of main memory cell array 30A are initially tested in order to check whether or not the memory cells are functioning properly. During the test period of array 30A, none of test signals TEST 1 to TEST M is supplied to exchange controller 46, and none of address detectors 52-1 to 52-M delivers a detection signal because address detectors 52-1 to 52-M are not programmed. As a result, OR gates 52-1 to 52-M supply output voltages of low level to spare word lines SPWL1 to SPWLM and to maintain redundancy memory cell array 30B in an inoperative state. On the other hand, NOR gate 54 delivers an output voltage of high level, enabling the selective operation of decoder 32. Address signals AR and AC are sequentially updated so that all of the memory cells of main memory cell array 30A are selected. In each selection, test data is written into and read out from the selected memory cell in order to detect whether the selected memory cell is defective or not.

The programming of address detectors 50-1 to 50-M is not performed at this stage and, subsequent to the test of main memory cell array 30A as set out above, the memory cells of redundancy memory cell array 30B are tested in order to check whether or not the memory cells are functioning properly During the test of array 30B, test signals TEST 1 to TEST M are supplied by turns to exchange controller 46. For example, when test signal TEST 1 is supplied, NOR gates 54 delivers an output voltage of low level, disabling the selective operation of decoder 32. On the other hand, OR gate 52-1 sets the potential of spare word line SPWL1 at high level, thus driving the memory cells on the spare word line SPWL1 in redundancy memory cell array 30B. OR gates 52-2 to 52-M set the potential of spare word lines SPWL2 to SPWLM at low level, so that the remaining memory cells in redundancy memory cell array 30B are not driven.

The programming of address detectors 50-1 to 50-M is effected subsequent to the test of redundancy memory cell array 30B.

Address detectors 50-1 to 50-M are, selectively programmed if the number of defective rows is smaller than M. When the programmed address detector 50-M detects a specified row address signal AR indicating the defect row address, then a high-level output signal is supplied from detector 50-M to NOR gate 54 and OR gate 52-M. At this time, NOR gate 54 delivers an output voltage of low level as control signal RDE, inhibiting the selective operation of row decoder 32. On the other hand, OR gate 52-M sets the potential of spare word line SPWLM at high level, driving the corresponding memory cells. Thus, the defective memory cells of the main memory cell array 30A is replaced by the memory cells of array 30B.

In this embodiment, the semiconductor memory device has bonding or test pads serving as input terminals for respective test signals TEST 1 to TEST M. Test signals TEST 1 to TEST M are used only at the time of the die sort test and are supplied from the outside to the pads. Therefore, after the packaging process, the memory device does not need to have package pins connected to the test pads. In this connection, it is necessary to set these pads at an inactive state or at a potential of low level in the absence of test signals TEST 1 to TEST M. The test pads may be bonded to the ground terminal after the defect inspection, but it will result in an increase in the number of pads for the bonding purpose. In order to avoid this increase, the memory device has resistive elements which cause the potentials of the test pads to be set at low level without bonding process. Each resistive element Ri (i =1 to M) is formed between a test pad PDi and ground terminal as shown in FIG. 6. In the case where the logic note of test signals TEST 1 to M is inverted, each resistive element Ri (i=1 to M) may be formed between a test pad PDi and power terminal VCC.

A second embodiment of the invention similar to the first embodiment will now be described with reference to FIG. 7. In the second embodiment, it is not necessary to supply all the aforementioned test signals TEST 1 to TEST M from the outside of the memory device chip. Test signals TEST 1 to TEST M may be internally generated by the use of the address signals AR and $\overline{AR}$ within the chip and one external test signal. For example, an internal test signal generation circuit as shown in FIG. 7 can be used to generate test signal TEST 1 to TEST 4.

In this case, test signal TEST 0 is externally supplied. That is, this circuit is used for the four spare rows and includes a decoder circuit formed of four 3-input AND gates 60-1 to 60-4 responsive to the combinations of bit address signals ARO and , AR1 and their complementary signal $\overline{ARO}$, $\overline{Ar1}$. Four pair sof output lines of buffer 36, that is, (AR0, AR1), ($\overline{ARO}$, AR1), (ARO, $\overline{AR1}$) and ($\overline{ARO}$, $\overline{AR1}$) are connected to the respective two input terminals of AND gates 60-1 to 60-4 and an external test signal TEST 0 is supplied to the remaining input terminals of AND gates 60-1 to 60-4 as a voltage signal of high level. AND circuits 60-1 to 00-4 generate respective test signals TEST 1 to TEST 4 in response to the external test signal TEST 0. The pad for external test signal TEST 0 is set at a potential of low level, all the output terminals of AND gates 60-1 to 60-4 are set at a potential of low level whereby no selection is made for the spare row. On the other hand, when external input test signal TEST 0 is supplied to the pad, the pad is set at a potential of high level. Then, either one of the output terminals of AND gates 60-1 to 60-4 becomes a high potential level. That is, one of these AND gates 60-1 to 60-4, upon receipt of one (1, 1) of the four combinations (AR0, AR1), AR1), (AR0, and $\overline{AR1}$) and ($\overline{AR0}$), $\overline{AR1}$) of the bit address signals ARO and AR1, delivers a high potential level and any one of the internal test signals TEST 1 to TEST 4 is generated. In this way, any spare row is selected so that the redundancy memory cell can be tested.

A third embodiment will now be described with reference to FIG. 8. In this embodiment, it is not necessary for the memory device to have a test pad dedicated to test signal TEST 0, through the three-level control of the potential of the existing bonding pad for receiving a signal necessary for the ordinary memory operation, such as a chip enable signal or address bit signal. That is, a detection circuit is additionally disposed between the existing bonding pad and the circuit of the second embodiment. FIG. 8 shows the detector circuit. An address bit signal is supplied to existing bonding pad PD and then to inverter 62 at the input stage where it is inverted and supplied to row address buffer 36. Inverter 62 detects the logic level "1" or "0" of the input signal. The detector circuit includes an inverter 63 formed of P-channel MOS transistor 64 for a load and N-channel field MOS transistor 66 for driving. N-channel field transistor 66 is so designed as to have a threshold voltage higher than the power voltage VCC (=5 V) and, in this case, it is preferred to have a level of about 9 V. An input potential ranging from the ground potential to the VCC potential is applied to the aforementioned pad PD during the normal memory operation, but a higher voltage (for example, 10 V) than the threshold voltage on N-channel field transistor 66 is applied during the test of redundancy memory cell array 30B. Inverter 63 delivers an output signal to inverter 68, at which time the output signal of inverter 68 is employed as the test signal TEST 0.

In the aforementioned defect inspection of the memory chip, main memory cell array 30A and redundancy memory cell array 30B can be tested prior to the substitution process in which address detectors 50-1 to 50-M are selectively programmed. It is possible to omit the test of redundancy memory cell array 30B after the substitution process has been performed. In the defect inspection of an EPROM in particular, the inspection time can be largely reduced, since it is possible to omit the emission of the ultraviolet radiation onto the memory cell subsequent to the substitution process as well as a retesting. The needle-like probe is only applied once prior to the substitution process, thereby reducing the risk of an injury to the bonding pads. This ensures a high product yield.

According to the third embodiment, redundancy memory cell array 30B can be tested even after the packaging process. The package pins must be connected to the bonding pads for receiving the signals necessary to the ordinary memory operation. Therefore, when the bonding pad connected to the aforementioned detector circuit is set at a logic level (e.g., 10 V) different form the two logic levels (e.g., 0 V and 5 V) employed for the ordinary memory operation, the detector circuit detects the potential of 10 V is applied to the pad as the test signal, and generates internal test signal TEST 0.

Although, in the memory device, redundancy memory cell array 30B has been explained as being employed to substitute the defective rows of main memory cell array 30A, this invention can equally been applied to a memory device having a redundancy memory array for substituting the defective columns of the main memory cell array. In this case, the exchange circuit 46 is supplied with a column address signal AC and the complementary column address signal $\overline{AC}$, and the control signal RDE is used for controlling the selective operation of column address decoder 34.

This invention is not restricted to the EPROMs and can equally applied to the semiconductor memories of other types. Furthermore, this invention can be applied not only to the memory circuit packaged as a semiconductor memory device but also to the memory circuit packaged, together with a various logic circuit, as a semiconductor logic device, such as a memory attached microcomputer device.

What is claimed is:

1. A semiconductor memory device capable of operation in a test mode and an operation mode, comprising:
   a memory unit including a plurality of main memory blocks and at least one redundancy memory block;
   selection means for programmably selecting one of said main memory blocks or said at least one redundancy memory block, said selection means being programmable to select one of said at least one redundancy memory block in place of a specified main memory block when said device is in said operation mode; and
   control means for disabling said selection means in said test mode and for selecting said one redundancy memory block for testing when said selection means has not yet been programmed.

2. A semiconductor memory device according to claim 1, wherein said at least one redundancy memory block includes a single redundancy memory block, and said control means includes a bonding pad for receiving a test signal supplied to set the test mode.

3. A semiconductor memory device according to claim 2, wherein said control means includes:
   a control circuit, connected to said bonding pad, for disabling said selection means in response to the test signal; and
   a selection circuit connected to said bonding pad for selecting the single redundancy memory block in response to the test signal.

4. A semiconductor memory device according to claim 3, wherein said control means includes a potential setting means for causing said bonding pad to be set at a predetermined potential in the absence of said test signal.

5. A semiconductor memory device according to claim 4, wherein said potential setting means includes a resistive means connected between said bonding pad and a preset potential terminal.

6. A semiconductor memory device according to claim 1, wherein said at least one redundancy memory block includes a plurality of redundancy memory blocks, and wherein said control means includes a plurality of bonding pads, each of said bonding pads being capable of receiving a test signal supplied to set the test mode.

7. A semiconductor memory device according to claim 6, wherein said control means includes:
   a control circuit connected to each of said bonding pads for disabling said selection means in response to the test signal; and
   a plurality of selection circuits connected to the respective bonding pads, each of said selection circuits including means for selecting different one of said plurality of redundancy memory blocks in response to the test signal.

8. A semiconductor memory device according to claim 7, wherein said control means includes a plurality of potential setting circuits, each of said circuits including means for causing a corresponding bonding pad to be set at a predetermined potential in the absence of said test signal.

9. A semiconductor memory device according to claim 8, wherein each of said potential setting circuits includes a resistance means connected between the corresponding bonding pad and a preset potential terminal.

10. A semiconductor memory device according to claim 1, wherein said at least one redundancy memory block includes a plurality of redundancy memory blocks, and wherein said control means includes:
    a first bonding pad for receiving a test signal supplied to cause such device to operate in the test mode;
    a plurality of second bonding pads for receiving a test address signal supplied to designate one of the plurality of redundancy memory blocks;
    a decoding circuit having a plurality of output terminals for decoding said test address signal in response to said test signal to generate an internal test signal at one of the plurality of output terminals;
    a control circuit connected to each of the output terminals of said decoding circuit for disabling said selection means in response to the internal test signal; and
    a plurality of selection circuits connected to the respective output terminals of said decoding circuit, each of said selection circuits including means for selecting a different one of said redundancy memory blocks in response to the internal test signal.

11. A semiconductor memory device according to claim 10, wherein said first bonding pad serves as an input terminal for an operation signal having a first and second voltage level, and said test signal having a voltage level different than said first and second voltage levels, and
    wherein the device includes means for setting the potential of said first bonding pad at one of said first and second voltage levels in response to the operation signal and at said voltage level different than said first and second voltage levels in response to the test signal, and wherein said decoding circuit is connected to said first bonding pad by a test signal detector designed to detect that the first bonding pad is set at the voltage level different than said first and second voltage levels.

12. A semiconductor memory device according to claim 10, wherein said second bonding pads serve as input terminals for receiving an address signal supplied to designate one of said main memory blocks in the absence of said test signal at said first bonding pad.

13. A semiconductor memory device according to claim 1, wherein said semiconductor memory device is an EPROM.

14. A semiconductor memory device according to claim 1, wherein said memory unit is a matrix array of memory cells arranged in rows and columns, and each memory block includes the memory cells of the same row.

* * * * *

UNITED STATES PATENT AND TRADEMARK OFFICE
CERTIFICATE OF CORRECTION

PATENT NO. : 4,860,260
DATED : August 22, 1989
INVENTOR(S) : Shinji Saito et al.

It is certified that error appears in the above-identified patent and that said Letters Patent is hereby corrected as shown below:

In the title page under Inventors, "Oomorini" should be --Tokyo--.

Signed and Sealed this

Sixth Day of October, 1992

*Attest:*

DOUGLAS B. COMER

*Attesting Officer*  *Acting Commissioner of Patents and Trademarks*